United States Patent
Amikura

(10) Patent No.: US 7,651,584 B2
(45) Date of Patent: Jan. 26, 2010

(54) PROCESSING APPARATUS

(75) Inventor: Manabu Amikura, Nirasaki (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 10/586,050

(22) PCT Filed: Jan. 14, 2005

(86) PCT No.: PCT/JP2005/000395

§ 371 (c)(1),
(2), (4) Date: Jul. 14, 2006

(87) PCT Pub. No.: WO2005/069360

PCT Pub. Date: Jul. 28, 2005

(65) Prior Publication Data

US 2007/0158026 A1    Jul. 12, 2007

(30) Foreign Application Priority Data

Jan. 16, 2004 (JP) ............................ 2004-009505

(51) Int. Cl.
*C23F 1/00* (2006.01)
*C23C 16/00* (2006.01)
(52) U.S. Cl. .................. 156/345.34; 118/715; 118/724
(58) Field of Classification Search ............... 118/723 R
See application file for complete search history.

(56) References Cited

U.S. PATENT DOCUMENTS 5,595,606 A    1/1997  Fujikawa et al.

(Continued)

FOREIGN PATENT DOCUMENTS

EP    0 877 410    11/1998

(Continued)

OTHER PUBLICATIONS

English Language Version of the PCT Preliminary Examination Report (PCT Form PCT/ISA/237) under Chapter 1 for International Application No. PCT/JP2005/000395 having an International Filing date of Jan. 14, 2005.

*Primary Examiner*—Michael Cleveland
*Assistant Examiner*—Nathan K Ford
(74) *Attorney, Agent, or Firm*—Smith, Gambrell & Russell, LLP

(57) ABSTRACT

A shower head structure (26) includes a shower head main body (78) of a one-piece structure formed in a generally cup shape and having a bottom wall (78A) provided with a plurality of gas injection holes (30A, 30B) formed therein and a side wall (78B) rising from a peripheral portion of the bottom wall. A plurality of gas diffusion chamber forming plates (82A-82C) are housed in the shower head main body (78). A through-hole is formed in a head mounting frame (76) disposed on a ceiling of a processing vessel (24). An upper portion of the side wall (78B) of the shower head main body (78) is inserted into the through-hole, so that a part of the side wall (78B) is exposed to the exterior of the processing vessel. A cooling mechanism (84) is disposed at the upper end portion of the side wall (78B). Heat transfer between the cooling mechanism (84) and the bottom wall (78A) is enhanced, so that the temperature of the bottom wall (78A) can be controlled at a proper value, thereby preventing any adhesion of an unnecessary film onto the bottom wall (78A).

20 Claims, 7 Drawing Sheets

| U.S. PATENT DOCUMENTS | | | | | |
|---|---|---|---|---|---|
| 2002/0029748 A1 | 3/2002 | Kuwada et al. | JP | 10-321613 | 12/1998 |
| 2002/0192370 A1* | 12/2002 | Metzner et al. .......... 427/248.1 | JP | 2002-155364 | 5/2002 |
| 2003/0132319 A1* | 7/2003 | Hytros et al. ............... 239/548 | WO | WO 02/063065 A1 | 8/2002 |
| 2005/0000423 A1 | 1/2005 | Kasai et al. | | | |

FOREIGN PATENT DOCUMENTS

JP  08-291385  11/1996

* cited by examiner

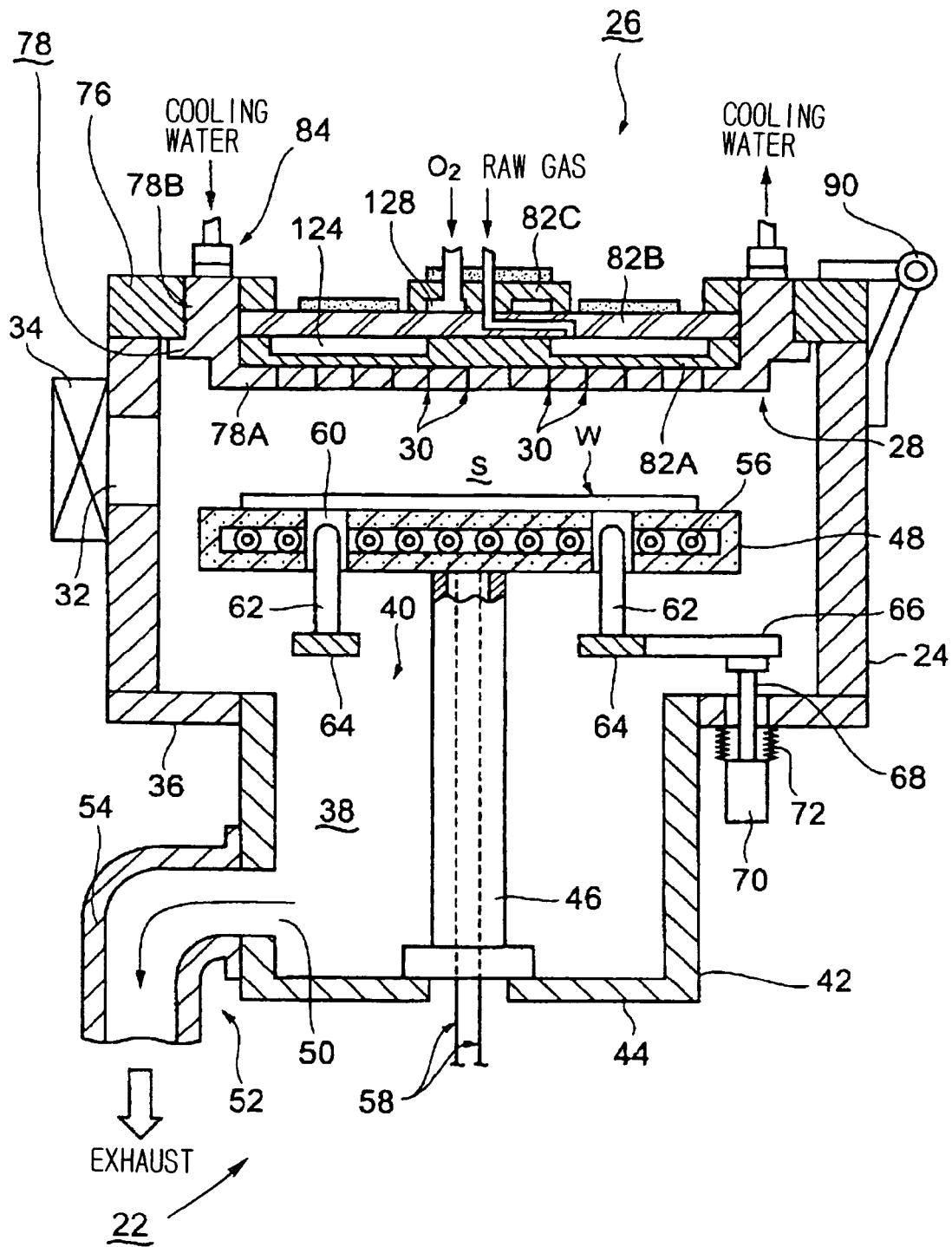
F I G. 1

PROCESSING APPARATUS

TECHNICAL FIELD

The present invention relates to a processing apparatus that processes a process object such as a semiconductor wafer by a predetermined process, for example, a thermal process for film deposition.

BACKGROUND ART

In general, various kinds of processes, such as a film forming process, an etching process, a thermal process, a modifying process and a crystallizing process, are repeatedly performed to a process object such as a semiconductor wafer in order to fabricate a semiconductor integrated circuit. When each of the various kinds of processes is performed, process gases required for the process are supplied into a processing vessel. JP 10-321613A discloses one example of an apparatus that performs a film forming process out of the foregoing processes. This film forming apparatus has a shower head structure disposed on a ceiling portion of a processing vessel which can be evacuated. A raw gas and a support gas such as an oxidizing gas or a reducing gas are supplied into the processing vessel through gas injection holes formed in the shower head structure, thereby depositing a thin film on the heated semiconductor wafer by CVD.

When a raw gas having a relatively low vapor pressure and a high activation energy is used, a film forming reaction occurs as soon as the raw gas is mixed with a support gas (e.g., oxidizing gas) before the raw gas is injected from the shower head structure. In order to prevent this, there is employed an injection system in which the raw gas is brought into contact with the support gas only after the raw gas is injected into the processing vessel from the shower head structure. Such an injection system is called a post-mix system.

FIG. 7 shows one example of a film forming apparatus employing the post-mix system. A film forming apparatus 2 includes a cylindrical processing vessel 4 which can be evacuated. A mount table 6, allowing a semiconductor wafer W to be placed thereon, is arranged in the processing vessel 4. A heater 8 is embedded in the mount table 8. A shower head structure 10 is arranged on the ceiling portion of the processing vessel 4 to supply a film forming gas into the processing vessel 4. The shower head structure 10 is composed of a plurality of head plates 10A to 10D stacked in layers and connected integrally with each other via bolts 12 (only some of them are shown in FIG. 7).

Plural recesses and gas channels connecting the recesses to each other are formed in the surface of each of the head plates 10A to 10D. Plural gas diffusion chambers 14A, 14B and 14C are formed when the head plates 10A to 10D are assembled. In the illustrated example, the gas diffusion chambers 14A and 14C are communicated with each other. The lowermost head plate 10A serves as a gas injecting plate provided therein with a number of gas injection holes 16. The gas injection holes 16 are classified into: a first group of gas injection holes 16A that communicate with the gas diffusion chamber 14A to inject the oxidizing gas such as $O_2$ gas; and a second group of gas injection holes 16B that communicate with the gas diffusion chamber 14B to inject the raw gas. The raw gas and the oxidizing gas flow separately through the shower head structure 10 without being mixed with each other, are individually injected into a processing space S through the gas injecting holes 16A and 16B, respectively, and then for the first time are mixed with each other in the processing space S. Consequently, deposition of an unnecessary film inside the shower head, which may result in particle generation, can be prevented, while a necessary film can be deposited substantially only on the wafer.

A cooling mechanism 18 such as a cooling jacket is attached to the peripheral portion of the upper surface of the shower head structure 10. The cooling mechanism 18 cools the lowermost head plate 10A down to a predetermined temperature in order to prevent the raw gas, which is likely to be thermally decomposed, from being decomposed immediately after the raw gas is injected from the gas injecting hole 16B, thereby to prevent adhesion of an unnecessary film, which may result in particle generation, to the lower surface of the head plate 10A, or the gas injecting surface.

Since the shower head structure 10 is constituted by stacking the plural flat head plates in layers and by joining them via the bolts, and moreover, the interior of the processing vessel 4 is maintained at a relatively low pressure, thermal conductivity among the head plates 10A to 10C is not so high. Therefore, the cooling mechanism 18 fixed to the head plate 10C can not effectively control the cooling of a part, near the gas injecting surface, of the head plate 10A. As a result, an unnecessary film may possibly adhere to the gas injecting surface.

As a film forming process to a wafer is performed repetitively, unnecessary thin films may possibly be deposited on the gas injecting surface, facing the processing space, in a region of several millimeters to several centimeters in diameter around each gas injection hole for injecting the raw gas. Such unnecessary thin films will peel off to be in particles, if they are left unattended. Thus, the shower head must be periodically cleaned. In the illustrated apparatus, since the shower head structure 10 is constituted by integrating the plurality of head plates 10A to 10C via the bolts 12, when the lowermost head plate 10A which is the main object to be cleaned is removed, the substantially whole shower head structure will be broken into individual component parts. Thus, the maintenance work is very complicated and time-consuming.

DISCLOSURE OF THE INVENTION

An object of the present invention is to provide a processing apparatus including a shower head structure having a gas injecting surface superior in temperature controllability.

Another object of the present invention is to provide a processing apparatus, in which only a component part having a gas injecting surface among component parts of a shower head structure can be independently separated from the other component parts, and thus, maintenance such as a cleaning work can be speedily carried out with ease.

In order to achieve the above objectives, the present invention provides a processing apparatus including a processing vessel, a mount table arranged in the processing vessel to allow a process object to be placed thereon, and a shower head structure arranged at a ceiling portion of the processing vessel to supply a process gas into an interior of the processing vessel, wherein the shower head structure includes: a shower head main body having a generally cup shape, the shower head main body having a bottom wall provided with a plurality of gas injection holes formed therein and a side wall rising from a peripheral portion of the bottom wall; a head mounting frame arranged at the ceiling portion of the processing vessel to support the shower head main body, the head mounting frame having at least one through-hole into which an upper portion of the side wall of the shower head main body is inserted; a cooling mechanism attached to an upper end portion of the side wall of the shower head main body inserted into the through-hole of the head mounting frame and exposed to an exterior of the processing vessel; screw bolts extending from the lower surface of the bottom wall of the shower head main body through the bottom wall of the shower head main body, and being in thread engagement with the head mounting frame; and at least one diffusion chamber forming plate housed in the shower head main body and joined to the head mounting frame, and defining a gas diffusion chamber which is supplied with the process gas and is communicated with the gas injection holes.

The present invention also provides a processing apparatus including a processing vessel, a mount table arranged in the processing vessel to allow a process object to be placed thereon, and a shower head structure arranged at a ceiling portion of the processing vessel to supply a process gas into an interior of the processing vessel, wherein the shower head structure includes: a shower head main body having a generally cup shape, the shower head main body having a bottom wall provided with a plurality of gas injection holes formed therein and a side wall rising from a peripheral portion of the bottom wall; a head mounting frame arranged at the ceiling portion of the processing vessel to support the shower head main body, wherein the shower head main body is attached to the head mounting frame such that an upper portion of the side wall of the shower head main body is exposed to an exterior of the processing vessel; a cooling mechanism attached to an upper end portion of the side wall of the shower head main body exposed to an exterior of the processing vessel; at least one diffusion chamber forming plate housed in the shower head main body and defining a gas diffusion chamber which is supplied with the process gas and is communicated with the gas injection holes.

In view of facilitating the maintenance work, it is preferable that the head mounting frame is fixed to the processing vessel via a hinge while allowing pivotal movement of the head mounting frame with respect to the processing vessel, so that the head mounting frame can be separated from the processing vessel.

Preferably, the head mounting frame has a plurality of through-holes, the upper portion of the side wall of the shower head main body is inserted into the plurality of through-holes, and the through-holes are arranged at angular intervals in a circumferential direction.

In a typical embodiment, there are provided a plurality of diffusion chamber forming plates which are stacked in layers in the shower head main body.

Preferably, the cooling mechanism includes a Peltier device and a cooling jacket allowing a coolant to flow therethrough.

BRIEF DESCRIPTION OF DRAWINGS

FIG. 1 is a cross-sectional view showing a first preferred embodiment of a processing apparatus according to the present invention;

BEST MODE FOR CARRYING OUT THE INVENTION

Figure 2:
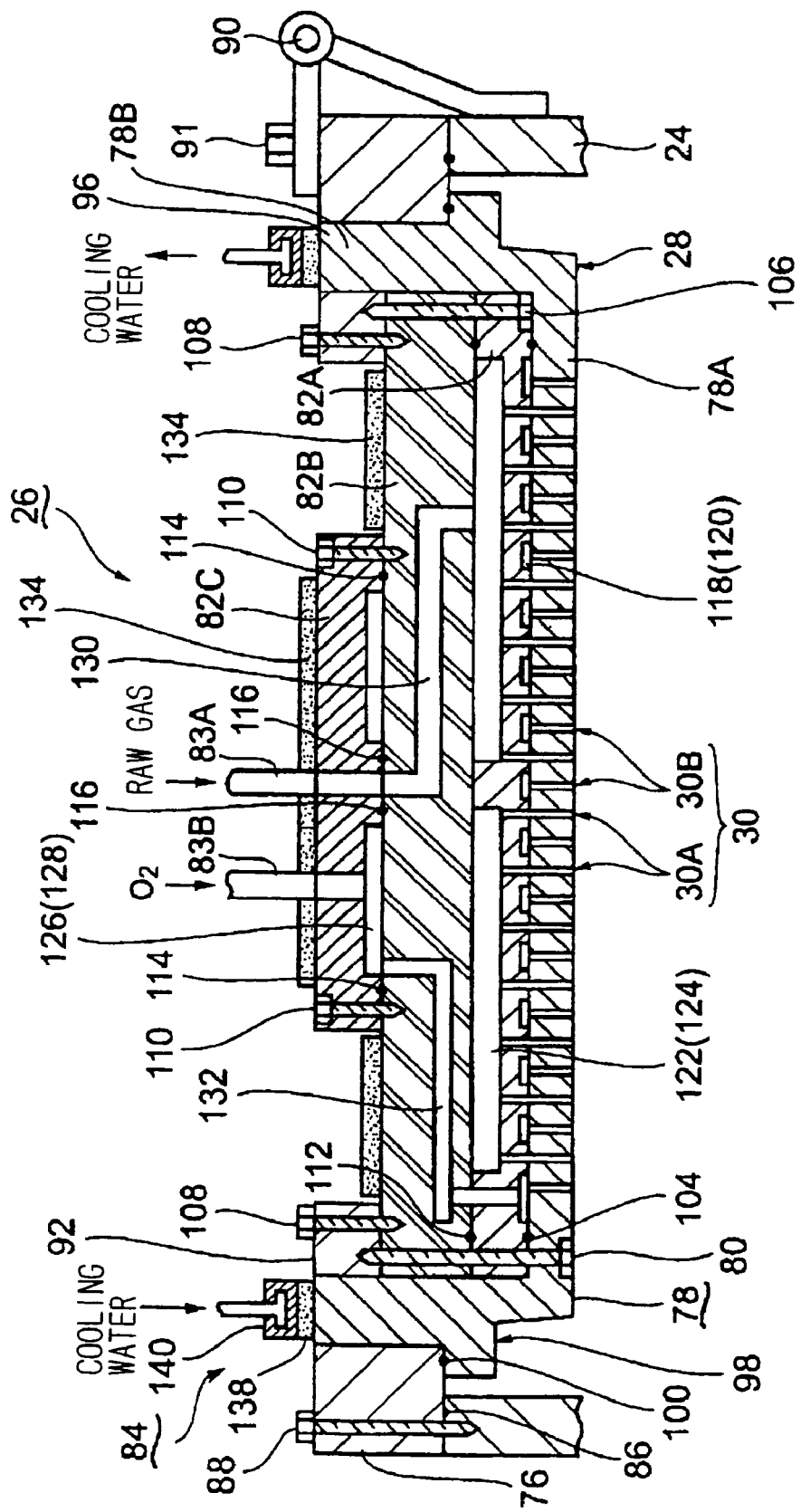
FIG. 2 is an enlarged cross-sectional view showing a shower head structure shown in FIG. 1.

A film forming apparatus, which is an embodiment of the processing apparatus according to the present invention, will be described with reference to the attached drawings.

First Embodiment

First, a first embodiment will be described with reference to FIGS. 1 to 4. A film forming apparatus 22 includes a processing vessel 24 of a substantially cylindrical shape, which has an opened ceiling portion and is made of aluminum. A shower head structure 26 is arranged on the ceiling portion of the processing vessel 24 to supply process gases for film deposition such as a raw gas and oxidizing gas into the processing vessel 24. A number of gas injection ports 30 are formed in the lower surface, or a gas injecting surface 28, of the shower head structure 26. The process gases are injected toward a processing space S through the gas injection ports 30. The detail of the shower head structure 26 will be described later.

Formed in the circumferential side wall of the processing vessel 24A is a carrying-in-and-out port 32, through which a semiconductor wafer W, or a process object, is transferred to and from the processing vessel 24. The carrying-in-and-out port 32 can be closed by a gate valve 34 in an airtight fashion. Formed in a vessel bottom wall 36 is a large opening 40, at which a bottomed cylindrical member 42 is attached to the vessel bottom wall 36. The interior space of the bottomed cylindrical member 42 serves as a down-exhausting space (hereinafter referred to as "exhaust space") 38 for the processing vessel 24. A cylindrical strut 46 extends upward from a bottom wall 44 of the bottomed cylindrical member 42. A mount table 48 is fixed to the upper end of the strut 46 by welding. The strut 46 and the mount table 48 may be made of a ceramic material such as AlN.

The opening 40 serving as an inlet of the exhaust space 38 has a diameter smaller than that of the mount table 48. Therefore, the process gas flowing down through a space outside the periphery of the mount table 48 turns into a space below the mount table 48, and flows into the opening 40. An exhaust port 50 facing the exhaust space 38 is formed at a lower portion of the side wall of the bottomed cylindrical member 42. An evacuation system 52 is connected to the exhaust port 50. The evacuation system 52 includes an exhaust pipe 54 provided therein with a vacuum pump (not shown), and is capable of suctioning and exhausting the atmosphere in the exhaust space 38.

The exhaust pipe 54 is provided therein with a pressure-regulating valve (not shown). The opening of the pressure-regulating valve is automatically adjusted in order to keep a pressure in the processing vessel 24 at a predetermined value or rapidly change it to a desired value. A heating means 56 comprising a resistance heater such as a carbon wire is embedded in the mount table 48. A controlled electric power is supplied to the heating means 56 via feed lines 58 arranged in the strut 46, thereby heating the semiconductor wafer W placed on the mount table 48.

Plural (in the illustrated embodiment, three) pin insertion holes 60 (only two of them are shown in FIG. 1) are formed in the mount table 48 to penetrate the same. A lifting pin 62 is loosely fitted into each of the pin insertion holes 60 to move vertically therethrough. A lifting ring 64, made of a ceramic material such as alumina, is arranged at the lower end of the lifting pin 62. The lower end of each lifting pin 62 is not securely fixed to the lifting ring 64 but is supported by the lifting ring 64. An arm 66 extending from the lifting ring 64 is connected to a rod 68 penetrating the bottom wall 36 of the processing vessel. The rod 68 is capable of vertical movement by an actuator 70. Thus, each lifting pin 62 can project upward from the upper end of each pin insertion holes 60 when the wafer W is transferred between the mount table 48 and a wafer conveying arm (not shown). An expandable bellows 72 surrounding the rod 68 is held between the bottom wall 36 of the processing vessel and the actuator 70, so that the rod 68 can move vertically while maintaining air-tightness of the processing vessel 24.

Next, the shower head structure 26 will be described in detail in reference to FIGS. 2 to 4. The shower head structure 26 includes a head mounting frame 76, a shower head main body 78 and diffusion chamber forming plates 82A, 82B and 82C which are housed in the shower head main body 78 to define gas diffusion chambers. The head mounting frame 76 is arranged on the peripheral portion of the ceiling portion of the processing vessel 24, and more specifically, it is arranged on the upper end on the circumferential side wall of the processing vessel 24 in the illustrated embodiment. The shower head main body 78 includes a bottom wall 78A provided therein with the plural gas injection ports 30 and a side wall (i.e., a peripheral side wall) 78B rising from the periphery of the bottom wall 78A, and thus is formed in a shallow cup shape, or a cylindrically bottomed shape, as a whole. The shower head main body 78 is fixed to the head mounting frame 76 together with the diffusion chamber forming plates 82A and 82B via screw bolts 80 inserted into the shower head main body 78 from the bottom wall (78A) side. Gas introducing ports 83A and 83B for introducing the process gas into the shower head structure 26 are formed in the uppermost diffusion chamber forming plate 82C. A cooling mechanism 84 for cooling the shower head main body 78 is arranged on the upper end on the side wall 78B of the shower head main body 78. Each of the foregoing component parts of the shower head structure 26 is made of nickel, a nickel alloy such as Hastelloy (registered trademark), aluminum, or an aluminum alloy.

Figure 3:
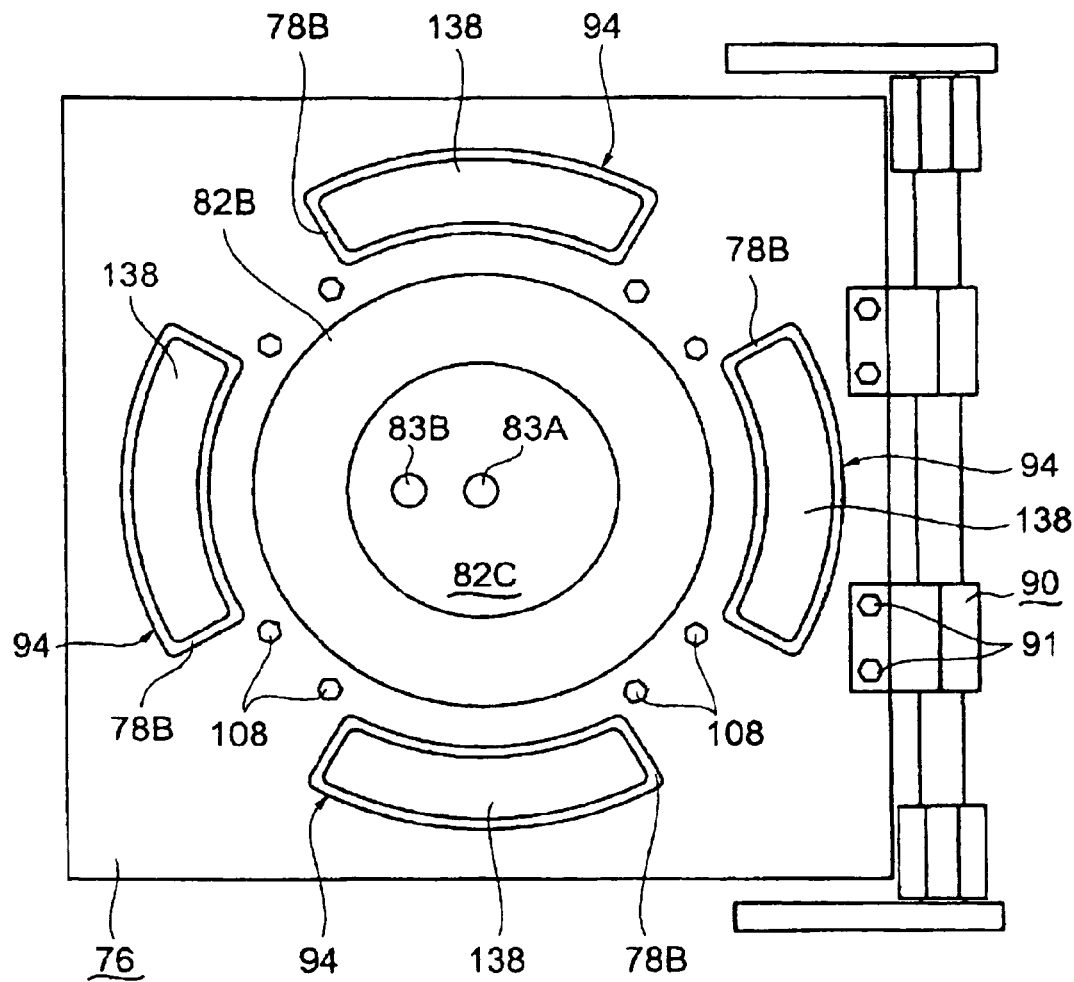
FIG. 3 is a simplified plan view of the processing apparatus showing a structure of essential parts of a head mounting frame.
Figure 4:
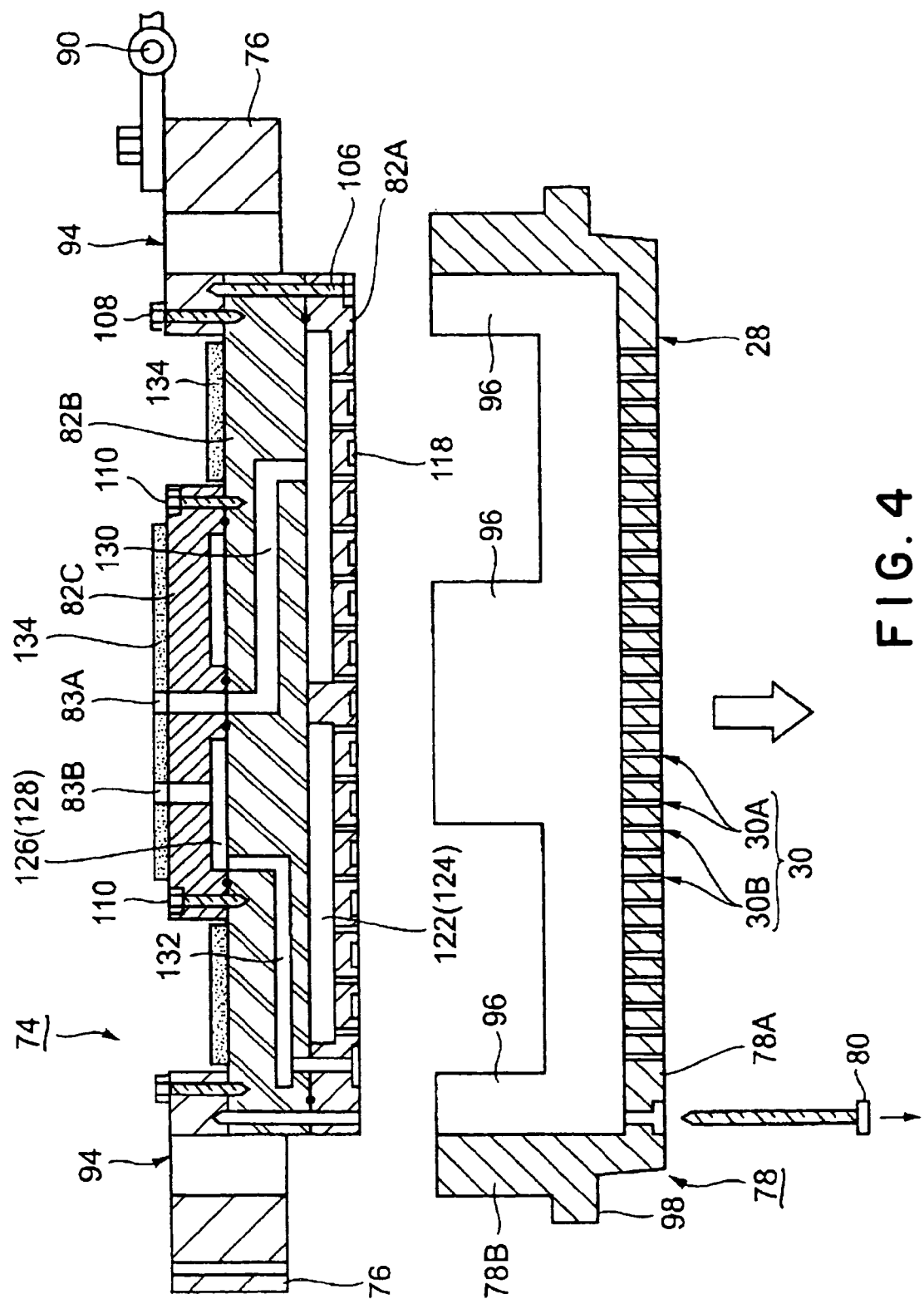
FIG. 4 is an exploded cross-sectional view showing the shower head structure shown in FIG. 2.

As shown in FIG. 3, the head-mounting frame 76 has generally a rectangular shape, in plan view. A circular, head fixing opening 74 having a large diameter is formed at the center of the head mounting frame 76. The head mounting frame 76 is securely fixed to the upper end on the circumferential side wall of the processing vessel 24 via a seal member 86 such as an O-ring by screw bolts 88 in an airtight fashion. Although only one of the screw bolts 88 is shown in FIG. 2, the plurality of screw bolts 88 are, in fact, circumferentially arranged at equal angular intervals. A hinge 90, which joins the head mounting frame 76 to the circumferential side wall of the processing vessel 24 while allowing the turning movement of the former with respect to the latter, is attached to one end of the head mounting frame 76 via screw bolts 91. In a state where the bolts 88 are removed, the shower head structure 26 can be turned (e.g., at an angle of 180°) as a unit about the turning axis of the hinge 90 by moving the hinge 90 by an actuator (not shown), so that portions, facing to the processing space S in the processing vessel 24, of the shower head structure 26 can be exposed to the exterior of the processing vessel 24. FIG. 3 further shows head mounting frame 76 as a unitary structure that is pivotable about hinge 90. FIGS. 3 and 4 also illustrate an embodiment of head mounting frame 76 which is monolithic.

The head mounting frame 76 has a ring-shaped fixing flange 92, which projects toward the center of the head fixing opening 74 and extend in a circumferential direction. Plural (in the illustrated embodiment, four) shower head main body insertion holes (i.e., through-holes) 94, each having a circular-arc shape, are formed in the fixing flange 92 and are arranged at angular intervals along the circumferential direction of the fixing flange 92 (see FIG. 3). The shower head main body insertion holes 94 passes through the head mounting frame 76 in a vertical direction. The shower head main body 78 has a one-piece structure in which the bottom plate 78A and the side wall 78B are inseparably integrated with each other. As previously described, the large number of gas injection ports 30 are formed in the bottom plate 78A. The gas injection ports 30 are classified into two groups: gas injection ports 30A of one group inject the raw gas; and the injection ports 30B of the other group inject the oxidizing gas such as $O_2$ gas.

Formed in the upper portion of the cylindrical side wall 78B of the shower head main body 78 are four projections 96, each of which has a circular-arc shape in plan view, and which are arranged along the circumferential direction of the side wall 78B. The projections 96 can be detachably fitted into the shower head main body insertion holes 94 formed in the head mounting frame 76, respectively (see FIGS. 3 and 4). When each projection 96 of the shower head main body 78 is fitted into respective shower head main body insertion hole 94 from below the head mounting frame 76, the upper end surfaces of the projections 96, which are parts of the shower head main body 78, are exposed to the atmospheric side. A ring-shaped sealing flange 98 projects outward from the outer circumferential surface of the side wall 78B. In assembly, a seal member 100 such as an O-ring (see FIG. 2) is interposed between the upper surface of the sealing flange 98 and the lower surface of the head mounting frame 76, whereby a gap therebetween is sealed in an airtight fashion.

As shown in FIG. 2, the shower head main body 78 is fixed to the fixing flange 92 of the head mounting frame 76 together with the lower two diffusion chamber forming plates 82A and 82B by the screw bolts 80, each of which is inserted upwardly into a hole formed in the bottom wall 78A from below the gas injecting surface 28, passes through the two diffusion chamber forming plates 82A and 82B, and is in thread engagement at the tip end portion thereof with the fixing flange 92. A seal member 104 such as an O-ring is interposed between the peripheral portion of the upper surface of the bottom wall 78A and the peripheral portion of the lower surface of the lowermost diffusion chamber forming plate 82A, whereby a gap therebetween is sealed in an airtight fashion. Although only one of the bolts 80 is shown in FIGS. 2 and 4, plural bolts 80 are, in fact, arranged along the circumferential direction of the shower head main body 78.

The lower two (82A, 82B) of the three diffusion chamber forming plates 82A, 82B and 82C have such an outer diameter that they (82A, 82B) are substantially in contact with the inner circumferential surface of the side wall 78B of the shower head main body 78 when they (82A, 82B) are housed in the shower head main body 78. The outer diameter of the uppermost diffusion chamber forming plate 82C is considerably smaller than those of the diffusion chamber forming plates 82A and 82B. The lowermost diffusion chamber forming plate 82A is fixed to the fixing flange 92 of the head mounting frame 76 together with the diffusion chamber forming plate 82B by screw bolts 106, each of which is inserted upwardly into a hole formed in the diffusion chamber forming plate 82A from below the same, passes through the middle diffusion chamber forming plate 82B, and is in thread engagement at the tip end portion thereof with the fixing flange 92. The diffusion chamber forming plate 82B is fixed to the fixing flange 92 of the head mounting frame 76 by screw bolts 108, each of which is inserted downwardly into a hole formed in the fixing flange 92 from above the same and is in thread engagement at the tip end portion thereof with the middle diffusion chamber forming plate 82B. The uppermost diffusion chamber forming plate 82G is fixed to the diffusion chamber forming plate 82B by screw bolt 110, each of which is inserted downwardly into a hole formed at the diffusion chamber forming plate 82C from above the same, and is in thread engagement at the tip end portion thereof with the middle diffusion chamber forming plate 82B. As regards the bolts 106, the bolts 108 and the bolts 110, only one or two of them are shown in FIG. 2, however, in fact, plural bolts are arranged along the circumferential direction of the shower head main body 78.

Seal members 112 and 114 such as O-rings are disposed at a peripheral portion of a joint surface between the lowermost and middle diffusion chamber forming plates 82A and 82B and at a peripheral portion of a joint surface between the middle and uppermost diffusion chamber forming plates 82B and 82C, respectively, in order to air-tightly seal the joint surfaces. In addition, seal members 116 such as O-rings are disposed at a center portion of a joint surface between the middle and uppermost diffusion chamber forming plates 82B and 82C, in order to seal a gap between a gas channel 130 (described later) and a gas diffusion chamber 126 (128).

Plural grooves 118, arranged concentrically, are formed at the lower surface of the lowermost diffusion chamber forming plate 82A. The diffusion chamber forming plate 82A and the shower head main body 78 are in close contact with each other when assembled, so that gas diffusion chambers 120 for the oxidizing gas are defined by the grooves 118. The gas injection ports 30B for the oxidizing gas communicate with the gas diffusion chambers 120. A wide groove 122 is formed in the upper surface of the lowermost diffusion chamber forming plate 82A. The diffusion chamber forming plate 82A and the middle diffusion chamber forming plate 82B are in close contact with each other when assembled, so that a gas diffusion chamber 124 for the raw gas is defined by the groove 122. The gas injection ports 30A for the raw gas communicate with the gas diffusion chamber 124. A wide groove 126 is formed in the lower surface of the uppermost diffusion chamber forming plate 82C. The diffusion chamber forming plate 82C and the middle diffusion chamber forming plate 82B are in close contact with each other when assembled, so that the gas diffusion chamber 128 for the oxidizing gas is defined by the groove 126. In the uppermost, middle and lowermost diffusion chamber forming plates 82C, 82B and 82A, the gas channel 130 is formed for connecting the raw gas introducing port 83A to the gas diffusion chamber 124 for the raw gas, and the gas channel 132 is formed for connecting the oxidizing gas introducing port 83B to the gas diffusion chambers 128 and 120 for the oxidizing gas. The gas channels 130 and 132 may be formed by, for example, boring. Note that, although the configuration of each of the gas channels 130 and 132 and the gas diffusion chambers 120, 124 and 128 is more complicated in practice, FIG. 2 shows a simplified configuration for easy understanding.

A heater 134 is arranged over the entire area, exposed to the atmosphere, of the upper surfaces of the middle and uppermost diffusion chamber forming plates 82B and 82C to heat the diffusion chamber forming plates in order to prevent condensation (re-liquefaction) of the raw gas introduced into the shower head structure 26. The cooling mechanism 84 is arranged on the upper surfaces, exposed to the atmosphere, of the side wall 78B (i.e., projections 96) of the shower head main body 78, which are inserted into the shower head main body insertion hole 94 when assembled. The cooling mechanism 84 may comprise Peltier devices 138 directly fixed to those upper surfaces and a cooling jacket 140 disposed along the circumferential direction of the shower head main body 78 in order to draw heat generated in the Peltier devices 138. A coolant such as cooling water flows in the cooling jacket 140, thereby efficiently cooling the shower head main body 78.

The operation of the film forming apparatus having the foregoing structure will be described by way of an example in which a thin film of hafnium oxide ($HfO_2$) is deposited on a semiconductor wafer W by using a raw gas comprising an organometallic hafnium (Hf) containing gas and an oxidizing gas comprising $O_2$ gas, as the process gases. First, an unprocessed semiconductor wafer W is carried into the processing vessel 24 through the opened gate valve 34 and the carrying-in-and-out port 32 while it is held by the conveying arm (not shown). The semiconductor wafer W is transferred to the elevated lifting pins 62, and thereafter is placed on the upper surface of the mount table 48 by lowering the lifting pins 62.

Next, the organometallic hafnium containing gas and the $O_2$ gas are supplied to the shower head structure 26 while their respective flow rates are controlled, to be injected into the processing space S through the gas injection ports 30A and 30B, respectively. The organometallic hafnium containing gas is prepared by solving an organometallic material, which is in a liquid state or solid state at room temperature, in a solvent such as octane, and vaporizing the resultant solution by means of a vaporizer. The atmosphere in the processing space S is maintained at a predetermined process pressure by evacuating the interior of the processing vessel 24 and the exhaust space 38 by driving the vacuum pump (not shown) disposed on the exhaust pipe 54, and by adjusting the opening of the pressure regulating valve (not shown) disposed on the exhaust pipe 54. At this time, the temperature of the wafer W is maintained at a predetermined process temperature by the heating means 56 provided in the mount table 48. In this way, an $HfO_2$ thin film is formed on the semiconductor wafer W.

The organometallic hafnium containing gas has high activity and is easily decomposed. Therefore, the organometallic hafnium containing gas is decomposed in a relatively short time when it is introduced into the processing space S. Furthermore, since the organometallic hafnium containing gas per se contains oxygen atoms, those oxygen atoms combine with Hf atoms, so that an $HfO_2$ film is deposited on the wafer by CVD (Chemical Vapor Deposition). The $O_2$ gas, which is an oxidizing gas, assists the above reaction.

Figure 7:
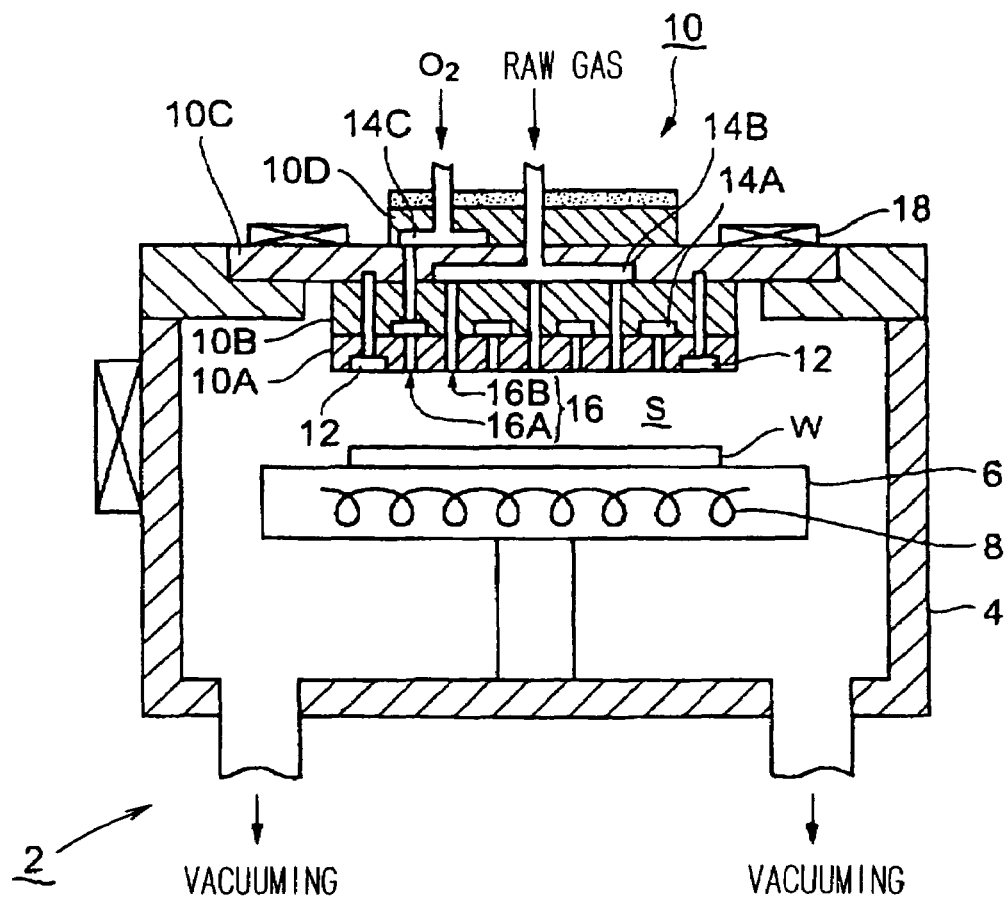
FIG. 7 is a cross-sectional view schematically showing the structure of a conventional film forming apparatus.

At this time, if the organometallic hafnium containing gas (i.e., the raw gas) flowing through the gas injection hole 30A toward the processing space S becomes excessively high in temperature, the raw gas is immediately decomposed so as to generate deposits on the inside of the gas injection holes 30A to close the same, or to generate a large amount of deposits on the gas injecting surface 28. Such an event can be inhibited by cooling the gas injecting surface 28 by the cooling mechanism 84. In the conventional apparatus shown in FIG. 7, heat is transferred through plural head plates, which are stacked in layers and are mechanically connected with each other. Therefore, the heat transferring efficiency is low, and thus effective cooling is not possible. In contrast, with the shower head structure in the illustrated embodiment, the bottom plate 78A of the shower head main body 78 and the side wall 78B having the cooling mechanism 84 attached thereto are formed in a single-piece structure, in other words, there is no mechanical joint in the heat transfer path from the bottom plate 78A to the cooling mechanism 84. Thus, the efficiency of the heat transfer from the bottom plate 78A to the cooling mechanism 84 is high, so that the temperature of the bottom plate 78A can be controlled by the cooling mechanism 84 with high accuracy. Moreover, since the portion of the side wall 78B, to which the cooling mechanism 84 is attached, is exposed to the atmosphere, the cooling mechanism 84 can sufficiently exhibit its cooling performance. Thus, the bottom plate 78A, or the gas injecting surface 28, can be maintained at a temperature, at which the raw gas is not condensed (re-liquefied) and the adhesion of the deposits can be prevented.

As described above, generation of the deposits can be remarkably reduced. However, it is inevitable that unnecessary films (i.e., unnecessary deposits), which generate particles or the like, will gradually adhere to the gas injecting surface 28 as plural number of semiconductor wafers W are processed. Thus, the gas injecting surface 28 must be cleaned, as needed. In this case, in the shower head structure in the prior art shown in FIG. 7, it is necessary to break the entire shower head structure into individual component parts in order to clean the gas injecting surface. Thus, the maintenance work is troublesome and time-consuming. In contrast, with the present preferred embodiment, it is not necessary to break the entire shower head structure 26 into individual component parts, and only the shower head main body 78 having the gas injecting surface 28 to be cleaned can be removed. Thus, the maintenance can be carried out readily and rapidly.

In cleaning the gas injecting surface 28, the cooling mechanism 84 fixed to the shower head main body 78 of the shower head structure 26 is first removed. And then, all the bolts 88, which fix the head mounting frame 76 in the shower head structure 26 to the processing vessel 24, are removed, so that the shower head structure 26 can be separated from the processing vessel 24.

Thereafter, the entire shower head structure 26 is turned at an angle of 90° or 180° about the axis of the hinge 90 disposed on one side of the head mounting frame 76 and thus is separated from the processing vessel 24, thereby exposing the gas injecting surface 28 of the shower head main body 78. In this state, all the bolts 80, which fix the shower head main body 78 to the fixing flange 92 of the head mounting frame 76, are removed, as shown in FIG. 4. And then, the shower head main body 78 is pulled out of the head mounting frame 76, as indicated by an outline arrow in FIG. 4. In this way, only the shower head main body 78 can be separated from the other component parts of the shower head structure 26 without disassembling the other component parts of the shower head structure 26. The other component parts, for example, the three diffusion chamber forming plates 82A to 82C may be kept to be fixed to the head mounting frame 76 since they need not be disassembled. Thus, the maintenance work such as the cleaning process can be remarkably simplified.

Second Embodiment

Figure 5:
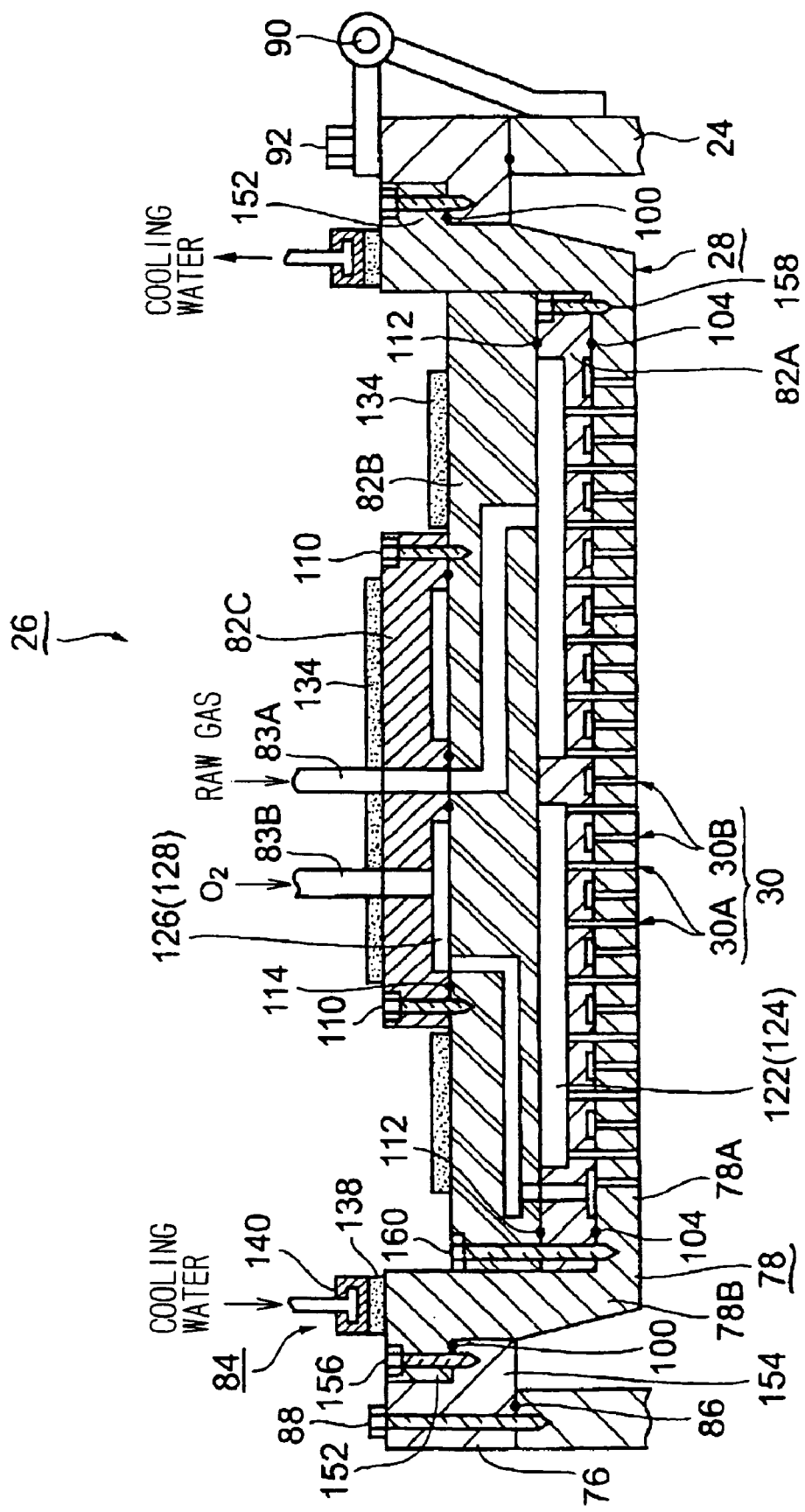
FIG. 5 is a cross-sectional view showing a shower head structure employed in a processing apparatus in a second embodiment according to the present invention.
Figure 6:
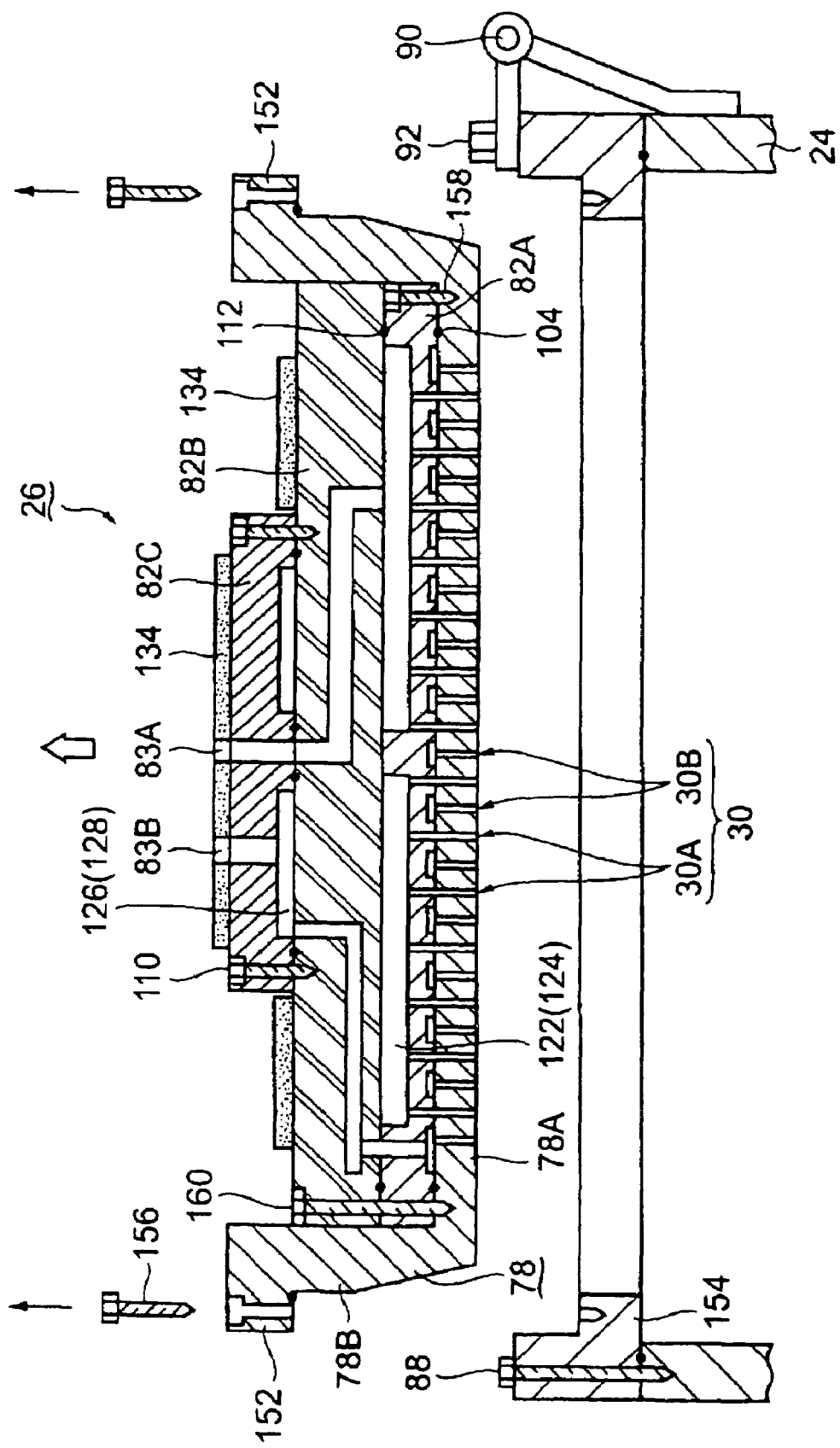
FIG. 6 is an exploded cross-sectional view showing the shower head structure shown in FIG. 4.

Next, the second embodiment of the present invention will be described with reference to FIGS. 5 and 6. A shower head structure in the second embodiment is different from that in the first embodiment in that the former is configured such that it is not possible to remove only a shower head main body from the shower head structure; but shower head structure in the second embodiment is similar to that in the first embodiment in that the former is also configured such that its shower head main body can be efficiently cooled. In FIGS. 5 and 6, the same component parts as those shown in FIGS. 1 to 4 are designated by the same reference numerals, and therefore, a duplicated explanation will be omitted below. In the second embodiment, a ring-shaped sealing flange 152 projecting outward and extending in a circumferential direction is provided at an outer circumferential surface of an upper portion of a side wall 78B of a shower head main body 78. An engaging step 154 is formed on an inner circumferential surface of a head mounting frame 76. The flange 152 is placed on and supported by the engaging step 154. A seal member 100 such as an O-ring is disposed at a contact surface between the flange 152 and the engaging step 154 to seal a gap between the flange 152 and the engaging step 154 in an airtight fashion. The flange 152 and the engaging step 154 are joined to each other by tightening a bolt 156 inserted into the flange 152 from above the same. The sealing flange 98, which is needed in the first embodiment (see FIG. 2), is not needed in the second embodiment.

Also in the second embodiment, the upper surfaces of the shower head main body 78 are exposed to the atmosphere, and a cooling mechanism 84 is fixed to those upper surfaces, like the first embodiment. In the second embodiment, a lowermost diffusion chamber forming plate 82A is secured to a bottom plate 78A of the shower head main body 78 via bolts 158. A middle diffusion chamber forming plate 82B is secured to the bottom plate 78A of the shower head main body 78 together with the lowermost diffusion chamber forming plate 82A via bolts 160, each of which is inserted into the diffusion chamber forming plate 82B from above the same. Also in the second embodiment, the bottom plate 78A and the side wall 78B of the shower head main body 78 are formed in a one-piece structure; the upper surfaces of the side wall 78B are exposed to the atmosphere; and the cooling mechanism 84 is fixed to the upper surfaces of the side wall 78B. Thus, the same temperature controllability of the bottom plate 78A of the shower head main body 78, or of the gas injecting surface 28, in the second embodiment can be achieved as in the first embodiment.

When a maintenance work such as a cleaning work of the shower head structure 26 in the second embodiment is carried out, the cooling mechanism 84 is removed; thereafter, all the bolts 156, which connect the shower head main body 78 to the engaging step 154 of the head mounting frame 76, are removed; and then the shower head main body 78 and all the diffusion chamber forming plates 82A to 82C housed in the shower head main body 78 are integrally removed upwardly from the head mounting frame 76 (see an outline arrow in FIG. 6), as shown in FIG. 6.

Although the present invention has been described based on the illustrated embodiments, the present invention is not limited to the foregoing embodiments. The present invention is particularly effective not only in performing the hafnium oxide film forming process by using the Hf-containing organometallic gas and the $O_2$ gas, but also in performing any process suffering from deposits which are originated from a process gas and are adhered to the shower head surface. The present invention is also effective in achieving the highly accurate temperature control of the gas injecting surface of the shower head, or in achieving easy maintenance of the shower head, regardless of whether or not the problem relating to the deposits exists. In addition, although the processing vessel 24 per se has no ceiling plate but the shower head structure 26 serves as a ceiling of the processing vessel in the illustrated embodiments, the present invention is not limited thereto. For example, the processing vessel 24 may include a ceiling plate having an opening, via which the shower head structure 26 is mounted. In this case, the head mounting frame 76 may be a component part independent of the ceiling plate; or the head mounting frame 76 and the ceiling plate may be integrated with each other as a single component part. Additionally, the specific configuration of the shower head structure is not limited to those in the illustrated embodiments. For example, the number of the diffusion chamber forming plates, the number of the gas diffusion chambers and the kind and number of process gas to be used may be appropriately changed, as needed. It should be also note that the process object is not limited to the semiconductor wafer, but it may be a glass substrate, an LCD substrate and the like.

The invention claimed is:

1. A processing apparatus including a processing vessel, a mount table arranged in the processing vessel to allow a process object to be placed thereon, and a shower head structure arranged at a ceiling portion of the processing vessel to supply a process gas into an interior of the processing vessel, wherein the shower head structure includes:

a shower head main body having a generally cup shape, the shower head main body having a bottom wall provided with a plurality of gas injection holes formed therein and a side wall rising from a peripheral portion of the bottom wall, wherein an upper end of the side wall has steps providing a plurality of projections;

a head mounting frame arranged at the ceiling portion of the processing vessel to support the shower head main body, the head mounting frame having a plurality of through-holes into which the projections of the side wall of the shower head main body are respectively inserted, with portions of the side wall other than the projections not being inserted into the through-holes, the through-holes and the projections being configured such that the projections are insertable into the through-holes from a lower side of the head mounting frame, and wherein the head mounting frame is a unitary structure and the shower head main body is attached to the unitary head mounting frame such that the projections of the side wall of the shower head main body is exposed to an exterior of the processing vessel; and at least one diffusion chamber forming plate housed in the shower head main body and defining a gas diffusion chamber which is supplied with the process gas and is communicated with the gas injection holes.

2. The processing apparatus according to claim 1, wherein the head mounting frame is fixed to the processing vessel via a hinge while allowing pivotal movement of the head mounting frame with respect to the processing vessel, so that the head mounting frame can be separated from the processing vessel.

3. The processing apparatus according to claim 1, wherein the through-holes are arranged at angular intervals in a circumferential direction.

4. The processing apparatus according to claim 3 wherein the head mounting frame comprises a circumferential, ring shaped flange extending radially between the through-holes and a surface defining a more central, circular head fixing opening in said head mounting frame.

5. The processing apparatus according to claim 3, wherein each of the through-holes passes completely through the head mounting frame in a vertical direction.

6. The processing apparatus according to claim 1, wherein the shower head structure includes, as said at least one diffusion chamber forming plate, a plurality of diffusion chamber forming plates, which are stacked in layers in the shower head main body.

7. The processing apparatus according to claim 1, further comprising a cooling mechanism and wherein the cooling mechanism includes a Peltier device and a cooling jacket allowing a coolant to flow therethrough, and said Peltier device being mounted on an upper end of said projection.

8. The processing apparatus according to claim 1 wherein said head mounting frame is a monolithic structure.

9. The processing apparatus according to claim 1, wherein the through-hole has a circular-arc shape in plan view.

10. The processing apparatus according to claim 1, wherein the portions of the side wall other than the projection not being inserted into the through-hole each have an upper surface extending beneath and along a lower surface portion of the head mounting frame.

11. A processing apparatus including a processing vessel, a mount table arranged in the processing vessel to allow a process object to be placed thereon, and a shower head structure arranged at a ceiling portion of the processing vessel to supply a process gas into an interior of the processing vessel, wherein the shower head structure includes:

a shower head main body having a generally cup shape, the shower head main body having a bottom wall provided with a plurality of gas injection holes formed therein and a side wall rising from a peripheral portion of the bottom wall, wherein an upper end of the side wall has steps providing a plurality of projections;

a head mounting frame arranged at the ceiling portion of the processing vessel to support the shower head main body, the head mounting frame having a plurality of through-holes into which the projections of the side wall of the shower head main body are respectively inserted, with portions of the side wall other than the projections not being inserted into the through-holes, the through-holes and the projections being configured such that the projections are insertable into the through-holes from a lower side of the head mounting frame, and wherein the head mounting frame is a unitary structure;

a cooling mechanism attached to an upper end portion of at least one of the projections of the side wall of the shower head main body inserted into the through-hole of the unitary head mounting frame and exposed to an exterior of the processing vessel;

screw bolts each extending from the lower surface of the bottom wall of the shower head main body through the bottom wall of the shower head main body, and being in thread engagement with the head mounting frame; and at least one diffusion chamber forming plate housed in the shower head main body and joined to the head mounting frame, and defining a gas diffusion chamber which is supplied with the process gas and is communicated with the gas injection holes.

12. The processing apparatus according to claim 11, wherein the head mounting frame is fixed to the processing vessel via a hinge while allowing pivotal movement of the head mounting frame with respect to the processing vessel, so that the head mounting frame can be separated from the processing vessel.

13. The processing apparatus according to claim 11, wherein the through-holes are arranged at angular intervals in a circumferential direction.

14. The processing apparatus according to claim 13 wherein the head mounting frame comprises a circumferential, ring shaped flange extending radially between the through-holes and a surface defining a more central, circular head fixing opening in said head mounting frame.

15. The processing apparatus according to claim 13, wherein each of the through-holes passes completely through the head mounting frame in a vertical direction.

16. The processing apparatus according to claim 11, wherein the shower head structure includes, as said at least one diffusion chamber forming plate, a plurality of diffusion chamber forming plates, which are stacked in layers in the shower head main body.

17. The processing apparatus according to claim 11, wherein the cooling mechanism includes a Peltier device and a cooling jacket allowing a coolant to flow therethrough.

18. The processing apparatus according to claim 11 wherein said head mounting frame is a monolithic structure.

19. The processing apparatus according to claim 11, wherein the through-hole has a circular-arc shape in plan view.

20. The processing apparatus according to claim 11, wherein the portions of the side wall other than the projection not being inserted into the through-hole each have an upper surface extending beneath and along a lower surface portion of the head mounting frame.

* * * * *